(12) United States Patent
Tempel (10) Patent No.: US 9,460,810 B2
(45) Date of Patent: *Oct. 4, 2016

(54) METHOD AND DEVICE FOR EVALUATING A CHIP MANUFACTURING PROCESS

(71) Applicant: Infineon Technologies AG, Neubiberg (DE)

(72) Inventor: Georg Tempel, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/989,822

(22) Filed: Jan. 7, 2016

(65) Prior Publication Data

US 2016/0118141 A1 Apr. 28, 2016

Related U.S. Application Data (63) Continuation of application No. 14/335,972, filed on Jul. 21, 2014, now Pat. No. 9,263,154.

(51) Int. Cl.
| | |
|---|---|
| G11C 29/00 | (2006.01) |
| G11C 29/04 | (2006.01) |
| G11C 29/42 | (2006.01) |
| G11C 29/44 | (2006.01) |
| G11C 29/56 | (2006.01) |
| H01L 21/66 | (2006.01) |

(52) U.S. Cl.
CPC ............... *G11C 29/04* (2013.01); *G11C 29/42* (2013.01); *G11C 29/44* (2013.01); *G11C 29/56008* (2013.01); *H01L 22/14* (2013.01); *G11C 2029/0403* (2013.01)

(58) Field of Classification Search
CPC . G11C 29/50; G11C 11/401; G11C 2229/00; G11C 29/00; G11C 29/08; G11C 19/12; G11C 29/48
USPC .................................................. 365/201, 200
See application file for complete search history.

(56) References Cited

U.S. PATENT DOCUMENTS 9,025,404 B1 * 5/2015 Signh ....................... 365/189.08

* cited by examiner

*Primary Examiner* — Huan Hoang
(74) *Attorney, Agent, or Firm* — Viering, Jentschura & Partner mbB (57) ABSTRACT

A method for evaluating a chip manufacturing process is described comprising measuring, for each of a plurality of chips manufactured in a chip manufacturing process, a bit failure rate of the chip, determining a distribution of bit failure rates from the measured bit failure rates; determining a maximum allowed bit failure rate from a given chip failure rate limit, determining a value representing the probability that a chip manufactured in the chip manufacturing process is below the maximum allowed bit failure rate and determining, based on the value, whether the chip manufacturing process is suitable for the chip failure rate limit.

16 Claims, 8 Drawing Sheets

METHOD AND DEVICE FOR EVALUATING A CHIP MANUFACTURING PROCESS

CROSS-REFERENCE TO RELATED APPLICATION

This application is a continuation of U.S. application Ser. No. 14/335,972, filed 21 Jul. 2014, the content of it being hereby incorporated by reference in its entirety for all purposes.

TECHNICAL FIELD

The present disclosure relates to methods and devices for evaluating a chip manufacturing process.

BACKGROUND

In chip manufacturing, it is typically important that the chip failure rate stays under a predetermined limit. For example, a customer may specify a maximum allowed chip failure rate and it must be checked whether this maximum allowed chip failure rate can be met with a certain chip manufacturing process. Accordingly, efficient approaches to evaluate a chip manufacturing process, e.g. with regard to a chip failure rate limit, are desirable.

SUMMARY

According to one embodiment, a method for evaluating a chip manufacturing process is provided including measuring, for each of a plurality of chips manufactured in a chip manufacturing process, a bit failure rate of the chip, determining a distribution of bit failure rates from the measured bit failure rates, determining a maximum allowed bit failure rate from a given chip failure rate limit, determining a value representing the probability that a chip manufactured in the chip manufacturing process is below the maximum allowed bit failure rate and determining, based on the value, whether the chip manufacturing process is suitable for the chip failure rate limit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

NVM (Non Volatile Memories) technologies may be evaluated using a qualification requirement as follows: every NVM specific reliability parameter (e.g. the bit failure rate (BFR), e.g. the data retention BFR) must be below a target level in a certain (low) number of experiments (e.g. for 2 lots with 2 wafers). In this approach, when, for example, the measured bit-failure rate is marginally below a limit (target BFR) the qualification is formerly considered as a pass. However, (a) lot to lot variations can lead to distinct amount of wafers, which may be well above the target BFR. Especially in the context of Chip Failure Rate being proportional to the square of the BFR in designs with Error Correction Codes (ECC) with 1 Bit correction, this marginal pass qualification is typically not acceptable. Further, also the opposite can happen (b). For example, for most of the measured chips the BFRs are very well below the target BFR, but a BFR measured for a single chip is above the target BFR. In this case the qualification may formerly not be a pass, although there can be a gigantic BFR margin for the rest of the chips.

Marginal passing qualification according to (a) may lead to higher BFRs than anticipated, making for example further tasks necessary. In the event of (b), the result for a product may be a BFR above a specified BFR although the technology may have been qualified and no problems are expected. A new qualification run can be carried out in this case which, however, introduces additional costs and possibly delays. In the following, embodiments are given that allow addressing these issues.

Figure 1:
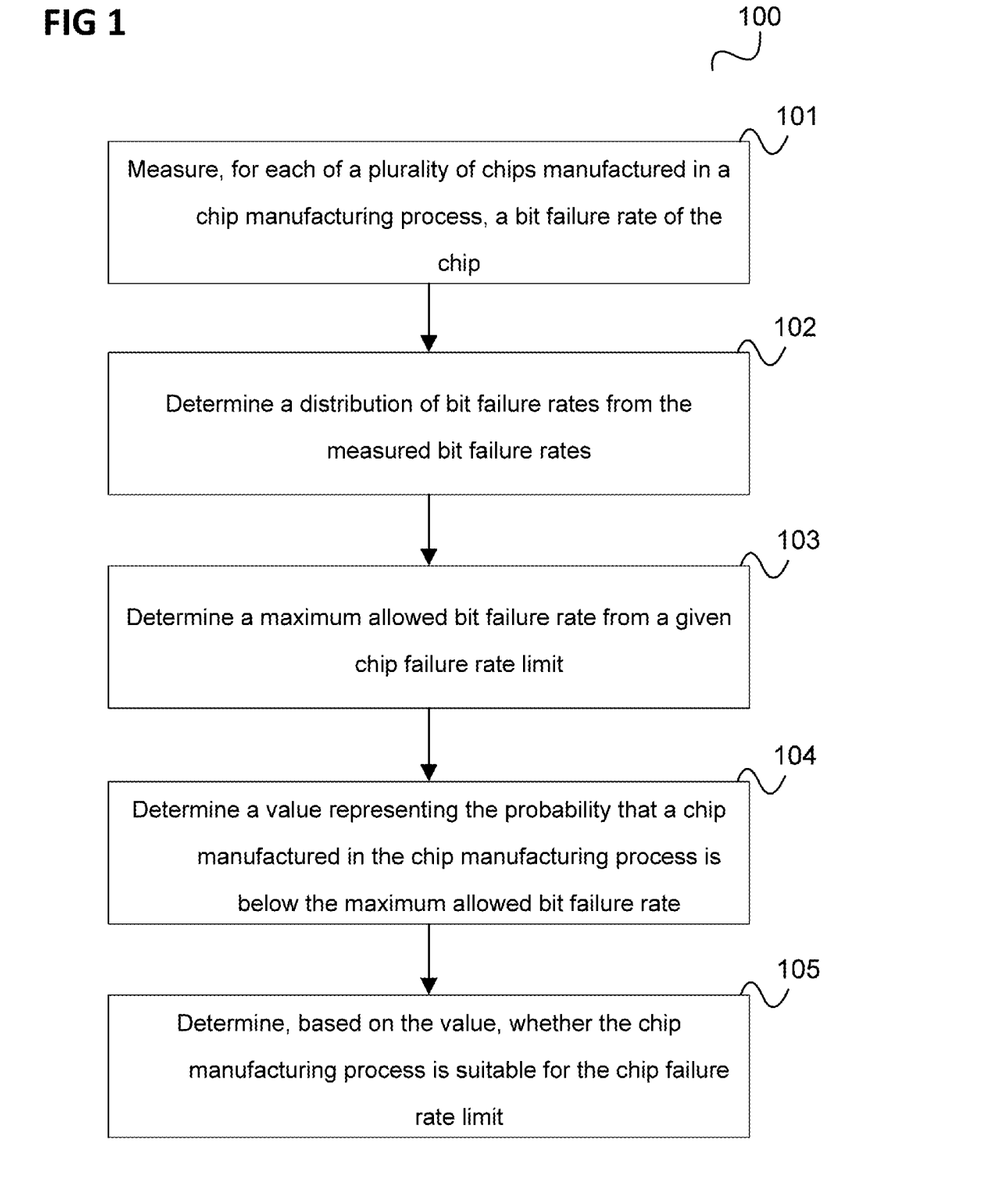
FIG. 1 shows a flow diagram illustrating a method for evaluating a chip manufacturing process.

FIG. 1 shows a flow diagram 100 illustrating a method for evaluating a chip manufacturing process according to an embodiment.

In 101, a bit failure rate of each of a plurality of chips manufactured in a chip manufacturing process is measured.

In 102, a distribution of bit failure rates is determined from the measured bit failure rates.

In 103, a maximum allowed bit failure rate is determined from a given chip failure rate limit.

In 104, a value representing the probability that a chip manufactured in the chip manufacturing process is below the maximum allowed bit failure rate is determined.

In 105, it is determined whether the chip manufacturing process is suitable for the chip failure rate limit based on the value.

In one embodiment, in other words, a bit failure rate limit is derived from a chip failure rate limit, a probability is determined that the bit failure rate limit is met by manufactured chips and based on the probability, it is determined whether the manufacturing process used for manufacturing the chips is suitable for the chip failure rate limit, i.e. to meet the chip failure rate limit, for example.

The method may for example further include adapting the chip manufacturing process if the chip manufacturing process is not suitable for the chip failure rate limit.

According to one embodiment, determining whether the chip manufacturing process is suitable for the chip failure rate limit includes determining whether the chip failure rate limit can be met with chips manufactured by means of the chip manufacturing process.

The chips are for example memory chips and the bit failure rate of a chip is for example a failure rate of bits of the memory of the chip.

For example, the chips are memory chips and the bit failure rate of a chip is a failure rate of bits of the memory of the chip due to a predetermined failure mechanism.

According to one embodiment, determining whether the chip manufacturing process is suitable for the chip failure rate limit includes comparing the value with a predetermined threshold.

The chip manufacturing process is for example determined to be suitable for the chip failure rate limit if the value is above the threshold.

According to one embodiment, determining the distribution of bit failure rates from the measured bit failure rates includes determining a log normal distribution of bit failure rates from the measured bit failure rates.

The method may include determining the value based on a mean value of the determined log normal distribution.

The method may include determining the value based on a standard deviation of the determined log normal distribution.

According to one embodiment, the value is a process capability index (Cpk).

For example, the value is a one-sided process capability index.

According to one embodiment, the method further includes determining the number of chips in the plurality of chips based on a predetermined confidence level.

Figure 2:
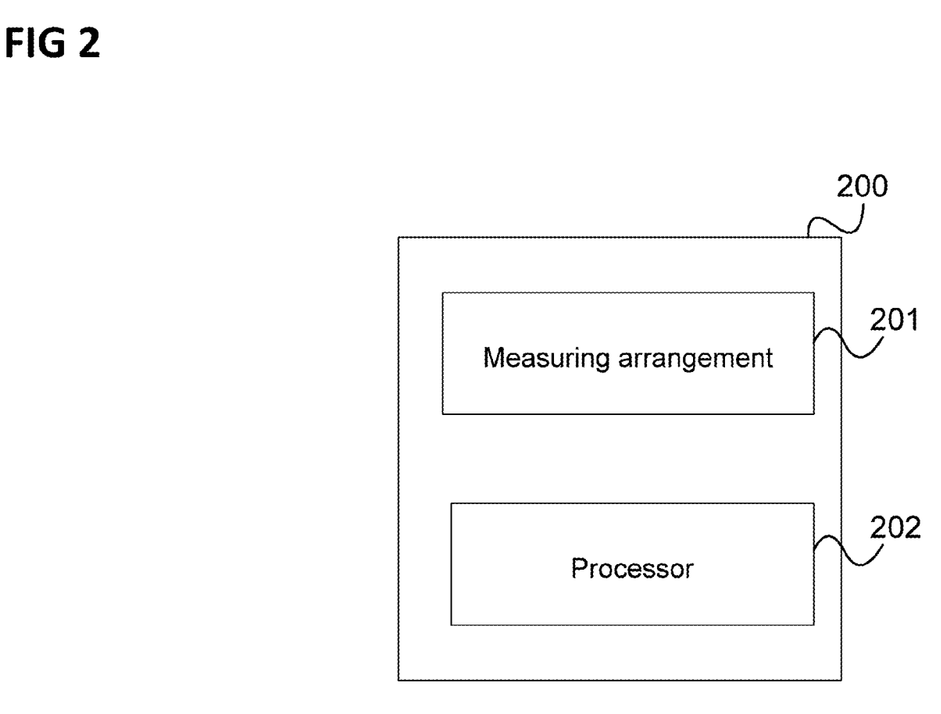
FIG. 2 shows a device for evaluating a chip manufacturing process.

The method illustrated in FIG. 1 is for example carried out by a device as illustrated in FIG. 2.

FIG. 2 shows a device for evaluating a chip manufacturing process 200. The device 200 includes a measuring arrangement 201 configured to measure, for each of a plurality of chips manufactured in a chip manufacturing process, a bit failure rate of the chip.

The device 200 further includes a processer 202 configured to determine a distribution of bit failure rates from the measured bit failure rates, determine a maximum allowed bit failure rate from a given chip failure rate limit, determine a value representing the probability that a chip manufactured in the chip manufacturing process is below the maximum allowed bit failure rate and determine, based on the value, whether the chip manufacturing process is suitable for the chip failure rate limit.

It should be noted that embodiments described in context with the method illustrated in FIG. 1 are analogously valid for the device 200 and vice versa.

The components of the device 200 (e.g. the measuring arrangement and the processor) may for example be implemented by one or more circuits. A "circuit" may be understood as any kind of a logic implementing entity, which may be special purpose circuitry or a processor executing software stored in a memory, firmware, or any combination thereof. Thus a "circuit" may be a hard-wired logic circuit or a programmable logic circuit such as a programmable processor, e.g. a microprocessor. A "circuit" may also be a processor executing software, e.g. any kind of computer program. Any other kind of implementation of the respective functions which will be described in more detail below may also be understood as a "circuit".

In the following, embodiments are described in more detail. Specifically, in the following, a Cpk approach for NVM reliability evaluation in terms of chip failure rate based on measured bit failure rates is described. For example, a Cpk value is determined and if the Cpk value fulfills a certain level, then the NVMs can be considered to pass the qualification. For example, for NVMs with a 1 bit failure correction mechanism a Cpk value of above 1.0 can be regarded to be sufficient to pass the qualification, e.g. to demonstrate a production capability. The approach described in the following actively uses the statistic of results for a plurality of chips and gives a direct production capability statement in the form of the Cpk value.

Figure 3:
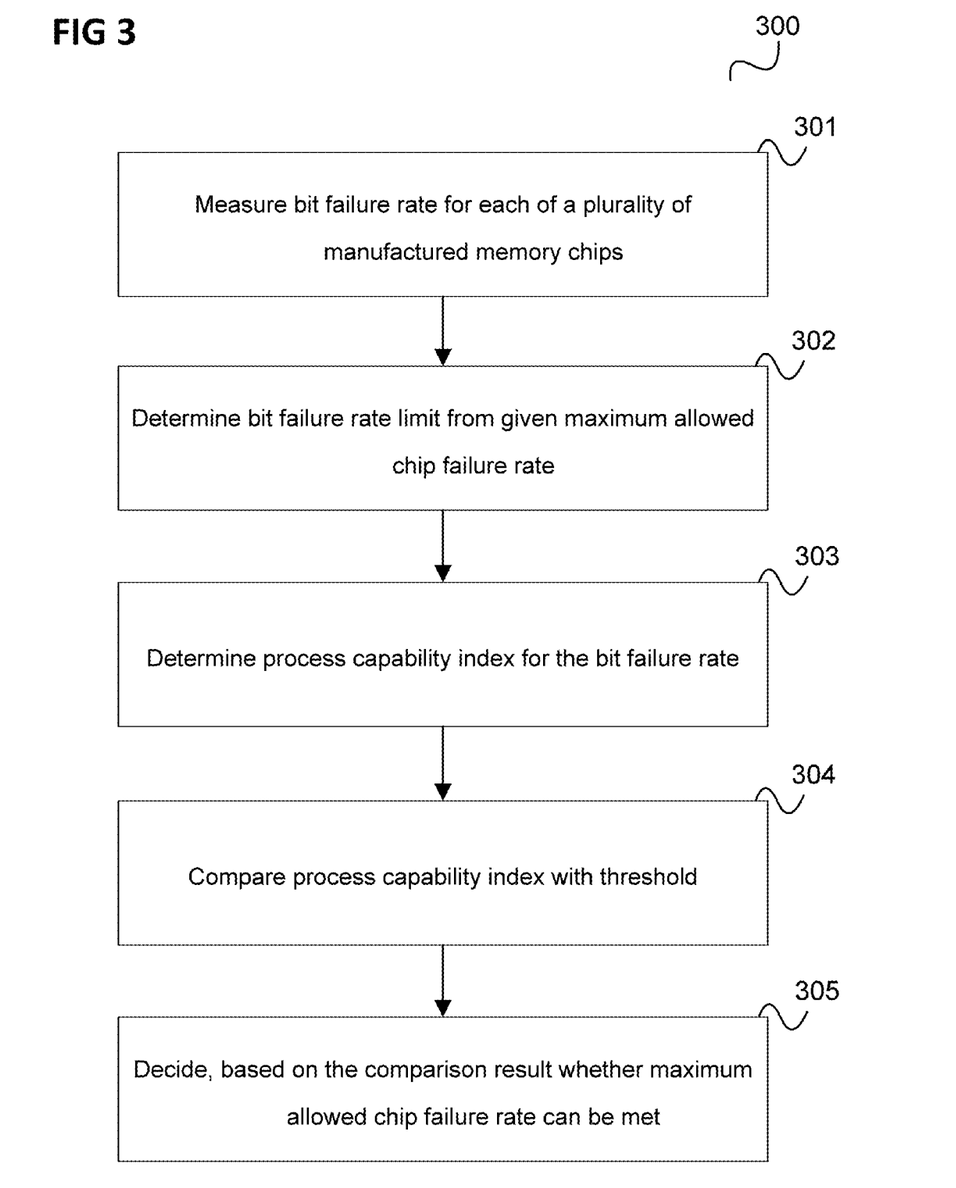
FIG. 3 shows a flow diagram illustrating an example for method for evaluating a chip manufacturing process based on a process capability index.

FIG. 3 shows a flow diagram 300.

In 301, for each of a plurality of manufactured memory (e.g. NVM) chips, the bit failure rate is measured.

Figure 4:
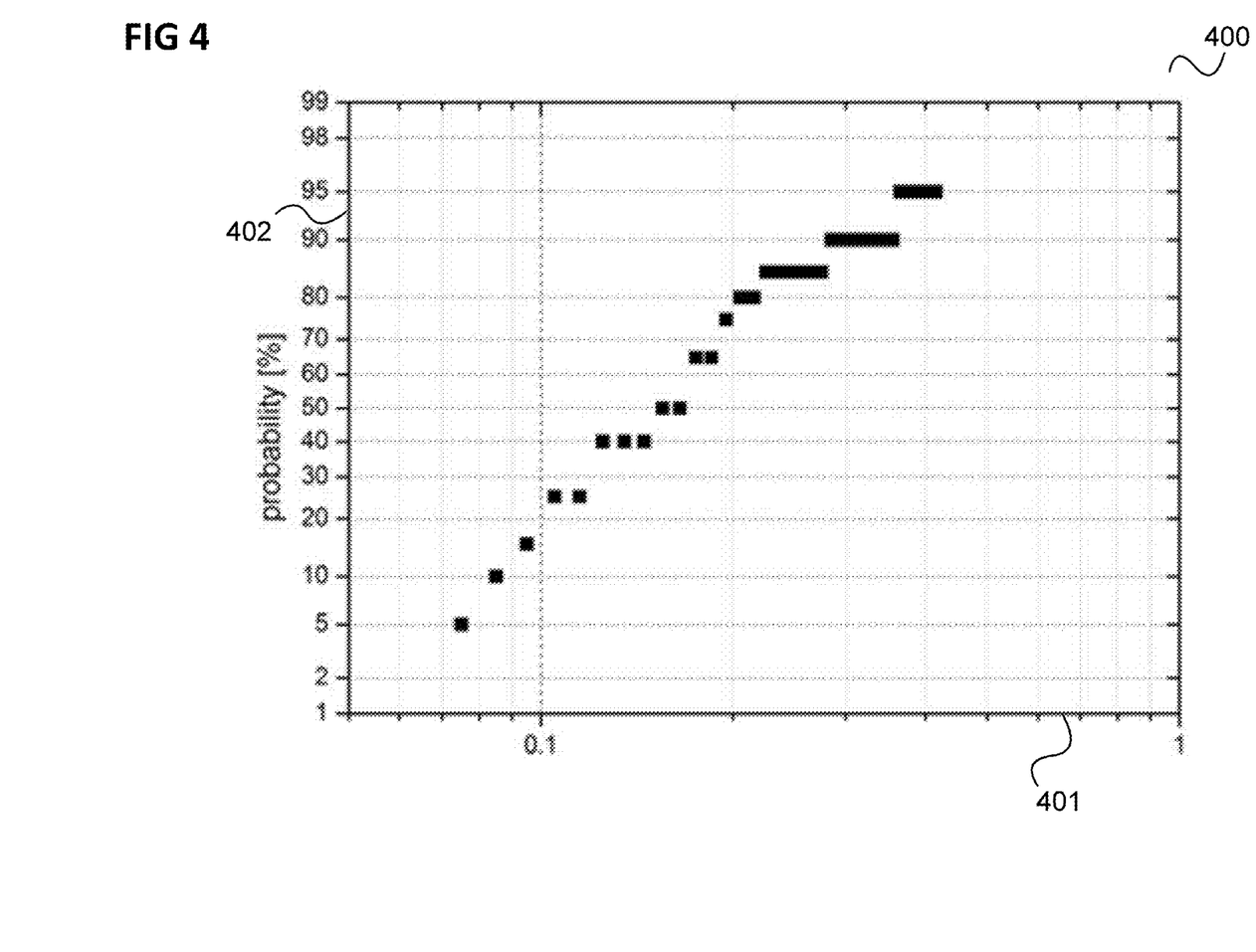
FIG. 4 shows a probability plot for an exemplary data set.

This gives rise to a distribution as illustrated in FIG. 4.

FIG. 4 shows a probability plot 400.

The x-axis 401 corresponds to the bit error rates (in logarithmic scale). The y axis gives probability.

As can be seen, the data points from the measurements approximately form a straight line. Thus the bit rate failures have a log-normal distribution which is a typical distribution found for bit failure rates.

Figure 5:
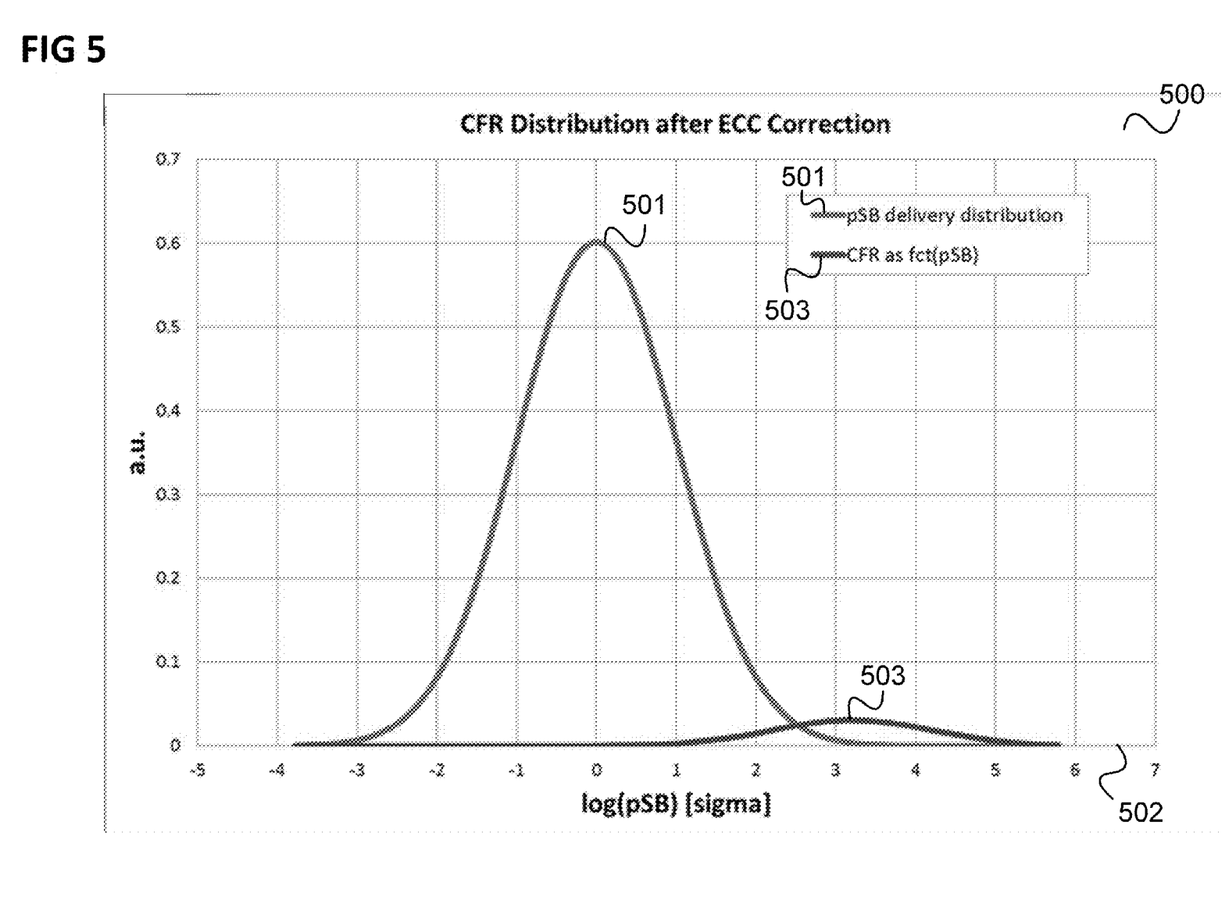
FIG. 5 shows a diagram illustrating a probability density function of bit failure rates.

A corresponding density function is illustrated in FIG. 5.

FIG. 5 shows a diagram 500 illustrating a probability density function 501 of bit failure rates.

The bit failure rates are also referred to as bit failure probabilities pSB. Their logarithmic values are given along the x-axis 502 in units of the standard deviation a of their (log normal) distribution.

Assuming that the chips include an ECC (error correcting code) functionality the chip failure rate (CFR) is given by the bit failure rate (pSB) according to $$CFR(p_{SB}) = g \cdot a \cdot \frac{(e \cdot a - 1)}{2} \cdot p_{SB}^2 \qquad (1)$$

where g is the total number of memory bits of the chip (including ECC bits)

e is the size of the data elements in the memory (including ECC bits)

g/e is the ratio of endangered bits within one data element of size e (i.e. the bits which may fail, e.g. depending on the considered fail mechanism) and ea is the number of endangered bits per data element.

It should be noted that equation (1) is an approximation of the binomial formula for the chip failure rate based on a Taylor approximation which is valid for small bit failure rates and 1 Bit ECC (i.e. only a single bit can be repaired per ECC word).

The chip failure rate resulting from a bit failure probability according to equation (1) weighted with the probability of pSB is indicated by a CFR graph 503 in FIG. 5.

The overall chip failure rate $CFR_{cumul.}$ assuming a log normal distribution of pSB (in other words, the integral of the CFR graph 503) is given by $$CFR_{cumul.} = g \cdot a \frac{(e \cdot a - 1)}{2} \cdot p_{mean}^2 \exp(2\hat{\sigma}^2 \cdot (\ln(10))^2) \qquad (2)$$

where $p_{mean} = p_{SB}(mean)$ is the mean of the distribution of pSB and $\sigma = \sigma_{log}$ is the sigma value (i.e. the standard deviation) of the distribution of $\hat{p}_{SB} = \log(p_{SB})$. It should be noted that herein log is used to indicate the logarithm to base 10.

It is assumed that a maximum allowed chip failure rate is given. According to equation (1), this limit for the chip failure rate corresponds to a limit for the bit failure rate.

In 302, the limit for the bit failure rate which is referred to as $p_{SB}(spec)$ is determined from the given maximum allowed chip failure rate.

In 303, a process capability index is calculated for the bit failure rate based on the limit for the bit failure rate.

A Cpk for a normally distributed process parameter x is typically calculated according to $$C_{pl} = \frac{\bar{x} - LSL}{3s} \quad (3)$$

$$C_{pu} = \frac{USL - \bar{x}}{3s} \quad (4)$$

$$C_{pk} = \min(C_{pl}, C_{pu}) \quad (5)$$

where $\bar{x}$ is the mean of the parameter x, LSL (lower specification limit) is the lower limit for the parameter x, USL (upper specification limit) is the upper limit for the parameter x and s is the standard deviation of the parameter x.

Since in the present case of a bit failure rate, only an upper bit failure rate limit is of interest (i.e. there is no lower limit for the bit failure rate since it is allowed to be as low as possible) the Cpk value is given by $$Cpk = \frac{\log(p_{SB}(spec)) - \log(p_{SB}(mean))}{3\sigma_{log}} \quad (6)$$

taking the log normal distribution of pSB into account. This can be referred to as a one-sided or single-sided Cpk.

In 304, the process capability index determined according to equation (6) is compared with a threshold.

In 305, based on the result of the comparison, it is determined whether it is considered to be possible to meet the maximum allowed chip failure rate.

For example the threshold is 1. So, for Cpk>1 it is decided that it is considered to be possible to meet the maximum allowed chip failure rate. It can be shown that a Cpk of 1 is sufficient to guarantee a specified CFR with a suitable ECC design. Other values for the Cpk threshold may be used such as 0.8, 0.9, 1.1 or 1.2. For example, a different Cpk threshold can be used for an extended ECC design e.g. a 2 Bit ECC with a 2 Bit correction.

Figure 6:
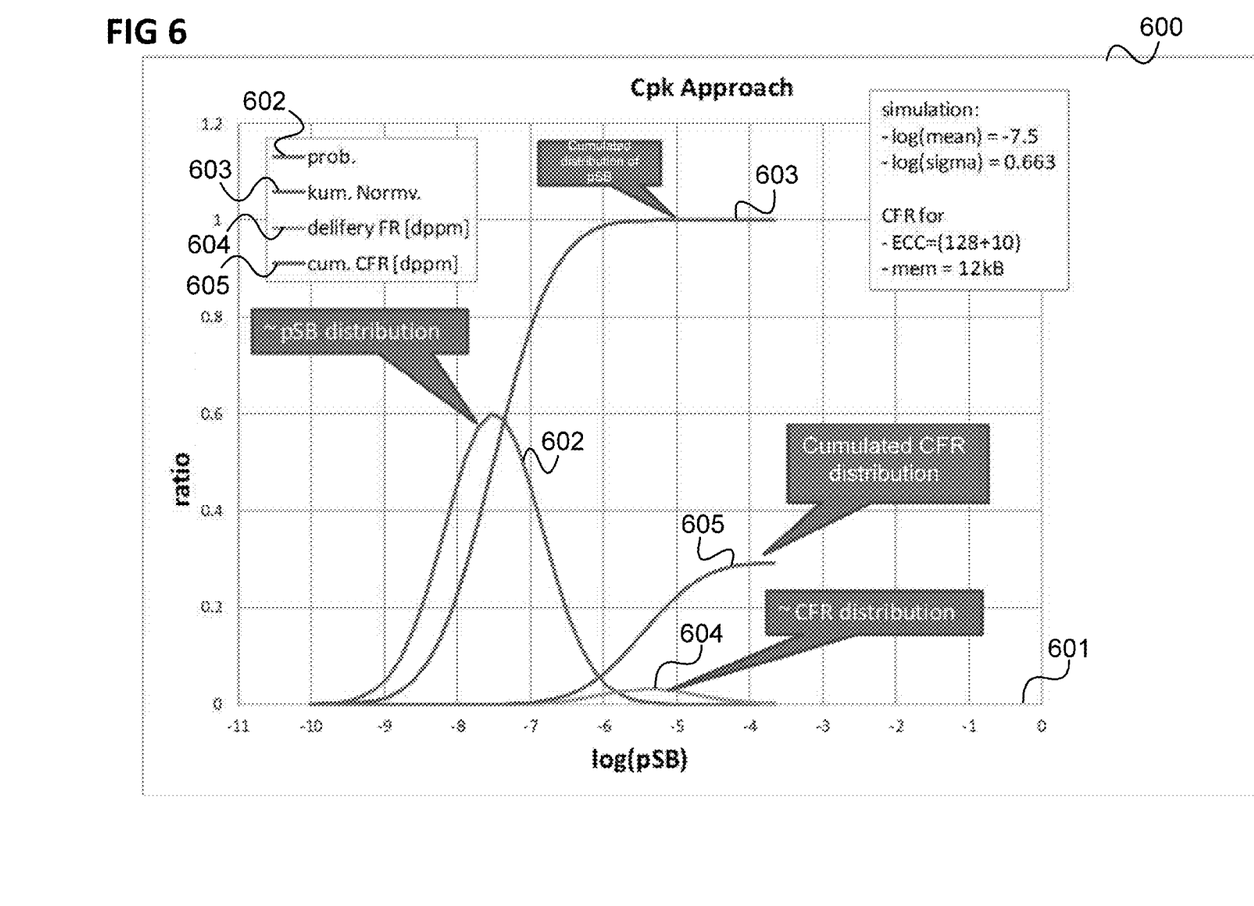
FIG. 6 shows a diagram according to another example for the bit failure rate distribution and the corresponding chip failure rate.

FIG. 6 shows a diagram 600 according to another example for the bit failure rate distribution and the corresponding chip failure rate.

As in FIG. 5, the values of $\log(p_{SB})$ are given along an x-axis 601. A first graph 602 shows the probability density function of the bit failure rate. A second graph 603 shows the cumulative distribution function of the bit failure rate. In this example, log p (mean)=−7.5 and $\sigma_{log}$=0.663.

A third graph 604 shows the corresponding values of the chip failure rates, similar to CFR graph 503 of FIG. 5. A fourth graph 605 shows the integral of the third graph 604.

The CFR values are given for an ECC of 128+10 (i.e. 10 correction bits for every 128 information bits) and a memory chip size of 12 kB.

For example, the maximum allowed chip failure rate is 10 ppm (parts per million) for example corresponding to a bit failure rate limit of 3 ppm.

Since the distribution of the bit failure rates is determined in 301 based on a finite number of chips, there may be an error in the Cpk value depending on the error in the bit failure rate distribution.

Figure 7:
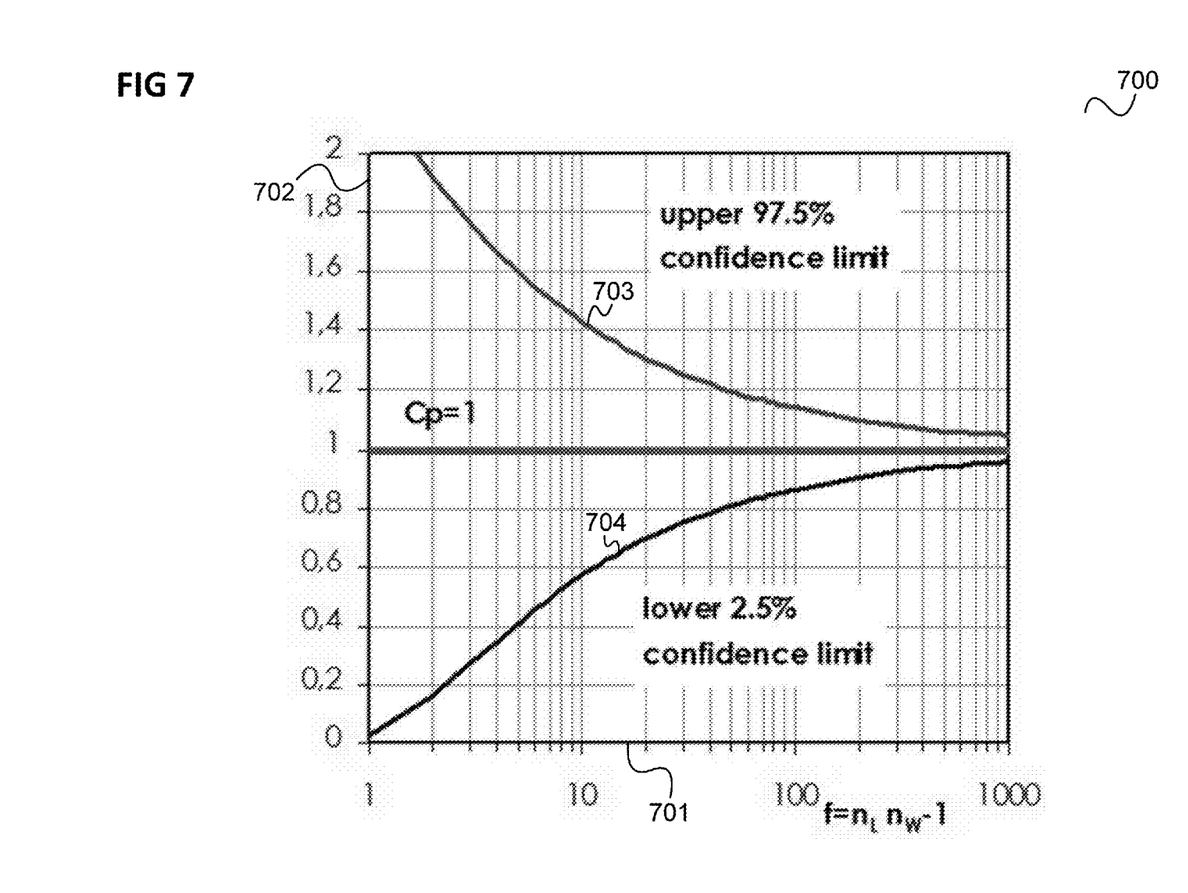
FIG. 7 shows the number of bit failure rate measurements needed to achieve a certain confidence interval.

FIG. 7 shows the number of bit failure measurements needed to achieve a certain confidence interval.

The number of measurements increases from left to right along an x axis 701. The Cpk values are indicated along a y axis 702. It is assumed that the Cpk value has been determined as 1.

For each number of measurements, a first graph 703 and a second graph 704 specify the confidence interval for a confidence limit of 95% (symmetrically around the Cpk value of 1). For example, to have an error of at most 20% with a confidence limit of 95%, 48 measurements are necessary.

The determination of the Cpk value may be carried out for different error mechanisms. This is illustrated in FIG. 8.

Figure 8:
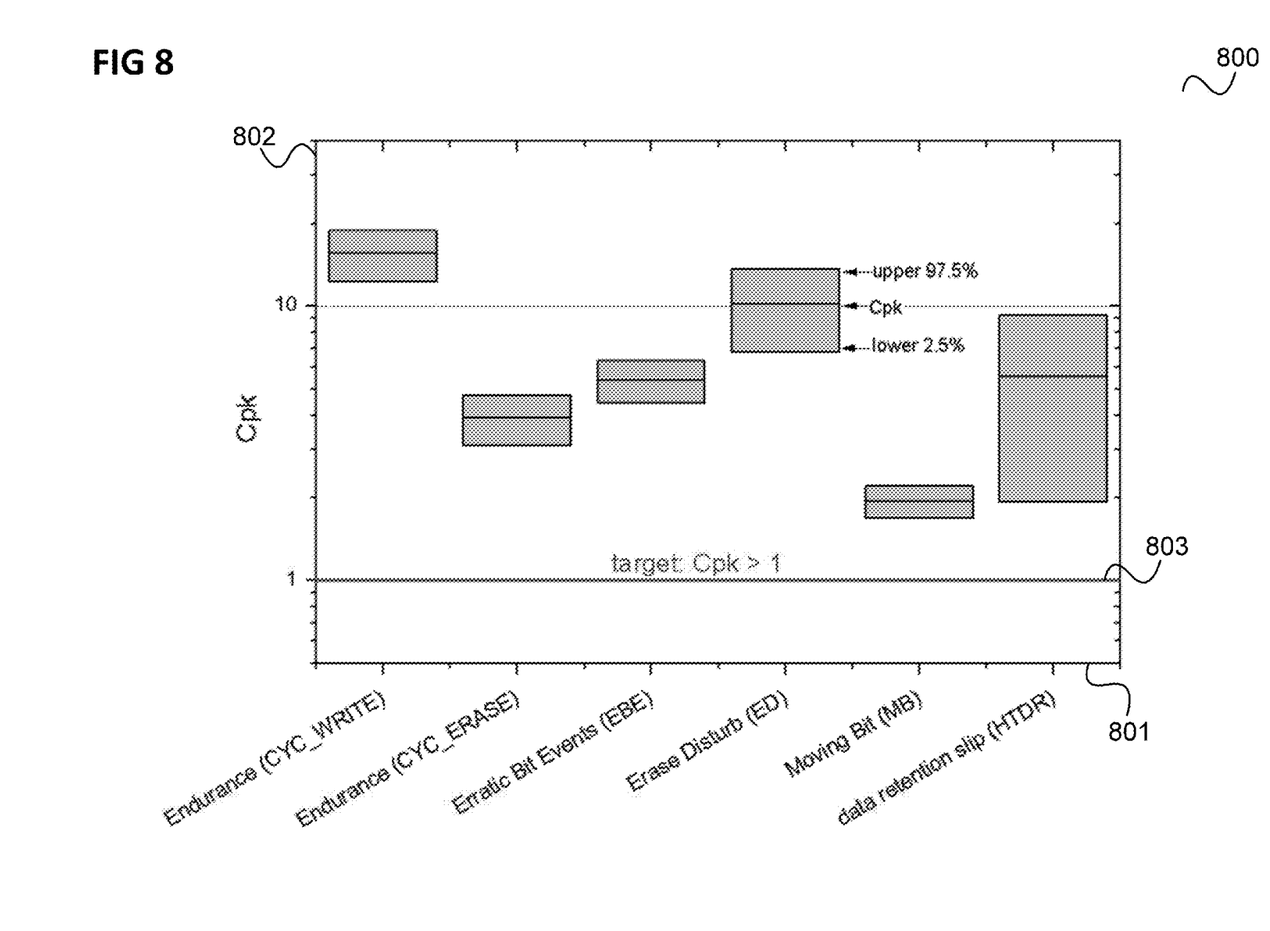
FIG. 8 shows examples for process capability index values for various bit failure mechanisms.

FIG. 8 shows Cpk values for a various bit failure mechanisms.

The bit failure mechanisms, e.g. moving bit and data retention slip, are indicated along the x-axis 801.

For each failure mechanism, the Cpk value and the confidence interval for a confidence limit of 95% (symmetric around the Cpk value) are indicated in accordance with a logarithmic y-axis 802. It should be noted that the width of the confidence intervals may differ for different failure mechanisms since, for example, different numbers of chips may be measured for the different failure mechanisms. As illustrated in FIG. 7, measurements may be added for a certain failure mechanism to reduce the width of the corresponding confidence interval.

A line 803 indicates the Cpk threshold of 1. As can be seen, in this example, all Cpk values and their confidence intervals are well above the line 803. Accordingly, the memory chips (or the corresponding manufacturing process) can be seen to pass the qualification criterion.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A method for evaluating a chip manufacturing process comprising:
    measuring, for each of a plurality of chips manufactured in a chip manufacturing process, a parameter value of a parameter which represents the reliability of the chip;
    determining a distribution of values of the parameter from the measured parameter values of the parameter;
    determining a minimum reliability from a given chip reliability requirement;
    determining a value representing the probability that a chip manufactured in the chip manufacturing process fulfills the minimum reliability; and
    determining, based on the value, whether the chip manufacturing process is suitable for the chip reliability requirement.

2. The method according to claim 1, further comprising adapting the chip manufacturing process if the chip manufacturing process is not suitable for the chip reliability requirement.

3. The method according to claim 1, wherein determining whether the chip manufacturing process is suitable for the chip reliability requirement comprises determining whether the chip reliability requirement can be met with chips manufactured by means of the chip manufacturing process.

4. The method according to claim 1, wherein the chips are memory chips and the parameter value which represents the reliability of a chip is a failure rate of bits of the memory of the chip.

5. The method according to claim 1, wherein the chips are memory chips and the parameter value which represents the reliability of a chip is a failure rate of bits of the memory of the chip due to a predetermined failure mechanism.

6. The method according to claim 1, wherein determining whether the chip manufacturing process is suitable for the chip reliability requirement comprises comparing the value with a predetermined threshold.

7. The method according to claim 6, wherein the chip manufacturing process is determined to be suitable for the chip reliability requirement if the value is above the threshold.

8. The method according to claim 1, wherein determining the distribution of values of the parameter from the measured parameter values comprises determining a log normal distribution of values of the parameter from the measured parameter values.

9. The method according to claim 8, comprising determining the value based on a mean value of the determined log normal distribution.

10. The method according to claim 8, comprising determining the value based on a standard deviation of the determined log normal distribution.

11. The method according to claim 1, wherein the value is a process capability index.

12. The method according to claim 1, wherein the value is a one-sided process capability index.

13. The method according to claim 1, further comprising determining the number of chips in the plurality of chips based on a predetermined confidence level.

14. The method according to claim 1, wherein the parameter value which represents the reliability of the chip is a bit failure rate of the chip, the minimum reliability is a maximum allowed bit failure rate and the chip reliability requirement is a chip failure rate limit.

15. The method according to claim 1, comprising determining the value representing the probability that a chip manufactured in the chip manufacturing process fulfills the minimum reliability based on the determined distribution of values of the parameter.

16. A device for evaluating a chip manufacturing process comprising:
a measuring arrangement configured to measure, for each of a plurality of chips manufactured in a chip manufacturing process, a parameter value of a parameter which represents the reliability of the chip,
a processor configured to
determine a distribution of values of the parameter from the measured parameter values of the parameter;
determine a minimum reliability from a given chip reliability requirement;
determine a value representing the probability that a chip manufactured in the chip manufacturing process fulfills the minimum reliability; and
determine, based on the value, whether the chip manufacturing process is suitable for the chip reliability requirement.

* * * * *